(12) United States Patent
VanBuren

(10) Patent No.: US 7,263,631 B2
(45) Date of Patent: Aug. 28, 2007

(54) SOFT ERROR DETECTION AND RECOVERY

(75) Inventor: Damon A. VanBuren, Parker, CO (US)

(73) Assignee: Seakr Engineering, Incorporated, Centennial, CO (US)

( * ) Notice: Subject to any disclaimer, the term of this patent is extended or adjusted under 35 U.S.C. 154(b) by 554 days.

(21) Appl. No.: 10/917,461

(22) Filed: Aug. 13, 2004

(65) Prior Publication Data
US 2006/0036909 A1    Feb. 16, 2006

(51) Int. Cl.
*G06F 11/00*    (2006.01)
(52) U.S. Cl. .................................... 714/15; 714/780
(58) Field of Classification Search ................ 714/15, 714/2, 20, 765, 780
See application file for complete search history.

(56) References Cited

U.S. PATENT DOCUMENTS

| | | | |
|---|---|---|---|
| 4,375,683 A | | 3/1983 | Wensley |
| 5,267,242 A | * | 11/1993 | Lavallee et al. ................ 714/7 |
| 5,321,698 A | | 6/1994 | Nguyen et al. |
| 5,418,473 A | | 5/1995 | Canaris |
| 5,530,802 A | | 6/1996 | Fuchs et al. |
| 5,590,277 A | | 12/1996 | Fuchs et al. |
| 5,604,753 A | | 2/1997 | Bauer et al. |
| 5,630,046 A | | 5/1997 | Loise |
| 5,701,314 A | * | 12/1997 | Armstrong et al. ......... 714/765 |
| 5,748,873 A | | 5/1998 | Ohguro et al. |
| 5,751,985 A | | 5/1998 | Shen et al. |
| 5,948,112 A | | 9/1999 | Shimada et al. |
| 6,047,370 A | | 4/2000 | Grochowski |
| 6,085,350 A | | 7/2000 | Emmert et al. |

(Continued)

FOREIGN PATENT DOCUMENTS

EP    0 315 303 A2    5/1989

(Continued)

OTHER PUBLICATIONS

Recovery with Limited Replay: Fault—Tolerant Processes in Linda, Srikanth Kambhatla, Dept. of Computer Science and Engineering, Oregon graduate Institute of Science and Technology; Dec. 9, 1990.

(Continued)

*Primary Examiner*—Dieu-Minh Le
(74) *Attorney, Agent, or Firm*—Miles & Stockbridge PC; James T. Carmichael

(57) ABSTRACT

A logic circuit is provided that implements soft error detection and recovery for protecting the logic circuit from the negative effects of soft errors caused by single event upsets. The logic circuit may include a configurable processing module, an input buffer, an output buffer, a configuration and scrub control module and a buffer control module. The configuration memory of the configurable processing element may be periodically read and checked for errors. If an error is detected, the configurable processing element may be at least partially reloaded, the output data produced since the last checking operation is discarded, and the input data may be reprocessed by the reloaded processing element. If no error is detected, then the output data may be marked for release and processing continues. Additionally, the logic circuit may include error checking of the input buffer, the output buffer and control logic to ensure that the logic circuit has complete soft error detection and recovery capability.

20 Claims, 12 Drawing Sheets

U.S. PATENT DOCUMENTS

| | | | |
|---|---|---|---|
| 6,127,864 A | 10/2000 | Mavis et al. | |
| 6,292,029 B1 | 9/2001 | Kumar et al. | |
| 6,504,411 B2 | 1/2003 | Cartagena | |
| 6,513,131 B1 | 1/2003 | Kanekawa et al. | |
| 6,526,559 B2 | 2/2003 | Schiefele et al. | |
| 6,546,505 B1 | 4/2003 | Swoboda et al. | |
| 6,549,443 B1 | 4/2003 | Jensen et al. | |
| 6,583,493 B1 | 6/2003 | Shoga | |
| 6,604,222 B1 | 8/2003 | Jensen | |
| 6,614,257 B2 | 9/2003 | Knowles | |
| 6,625,756 B1 * | 9/2003 | Grochowski et al. | 714/17 |
| 6,654,905 B1 | 11/2003 | Dickens | |
| 6,718,494 B1 * | 4/2004 | Jamil et al. | 714/723 |
| 2001/0025338 A1 | 9/2001 | Zumkehr et al. | |
| 2002/0059548 A1 | 5/2002 | Rushton | |
| 2002/0133745 A1 | 9/2002 | Okin | |
| 2002/0144177 A1 | 10/2002 | Kondo et al. | |
| 2002/0144179 A1 | 10/2002 | Cmelik et al. | |
| 2003/0061535 A1 | 3/2003 | Bickel | |
| 2003/0061537 A1 | 3/2003 | Cha et al. | |
| 2003/0074598 A1 | 4/2003 | Bossen et al. | |
| 2003/0163758 A1 | 8/2003 | Austen et al. | |
| 2005/0160311 A1 * | 7/2005 | Hartwell et al. | 714/7 |

FOREIGN PATENT DOCUMENTS

EP     0 411 805 A2     2/1991

OTHER PUBLICATIONS

Single Event Upset (SEU) Mitigation by Virtual Triple Module Redundancy (TMR) and Design Reduces Manufacturing Cost and Lowers Power; Sep. 23, 2003 http://klabs.org/richcontent/fpga_content/SEU_Hardening/papers/virtual_tmr_asc.pdf.

Single Event Upset (SEU) Mitigation Techniques; Jan. 20, 2003 for SRAM-Based FPGAs http://www.dac.com/40th/40acceptedpapers.nsf/0/e6c0b4b6377c538e87256dc60058c093/$FILE/dp38_1.PPT.

* cited by examiner

SOFT ERROR DETECTION AND RECOVERY

The present invention relates to electronic devices, and, more particularly, to high reliability electronic devices.

An electronic device may sometimes experience a "soft" error, which is an error from which the device can recover by the resetting or rewriting of the device. For example, electronic devices in satellites and other spacecraft are subjected to a barrage of high-energy particles. In addition to possible long-term effects, these particles can change the logic levels within the devices causing a serious short-term impact on the performance and operation of the electronic devices. These particle-induced errors, called single event upsets (SEUs), may corrupt data and cause the electronic devices to malfunction. The National Aeronautics and Space Administration (NASA) defines SEUs as radiation-induced errors in microelectronic circuits caused when charged particles (usually from the radiation belts or from cosmic rays) lose energy by ionizing the medium through which they pass, leaving behind a wake of electron-hole pairs.

The Earth is surrounded by a close-to-spherical magnetic field called the magnetosphere. It is theorized that the magnetosphere is generated by dynamo action in the Earth's interior where conducting liquid metals are kept in motion by convection (heat exchange), Coriolis force, and gravitation. Just as the charged windings in the coil of a dynamo generate a magnetic field when moved, these metallic masses in the Earth's core create the Earth's magnetic field. The magnetosphere shields the Earth from space radiation by deflecting high-energy particles from deep space or by capturing them in the Van Allen Belts. However, spacecraft and satellites do not receive the same level of protection that the magnetosphere provides for the surface of the earth.

At a certain location over the South Atlantic Ocean, off the coast of Brazil, the shielding effect of the magnetosphere is not quite spherical but shows a "pothole", or a dip, which may be a result of the eccentric displacement of the center of the magnetic field from the geographical center of the Earth (by 280 miles) as well as the displacement between the magnetic and geographic poles of Earth. For orbits tilted (inclined) between 35 and 60 degrees against Earth's equator and having altitudes of a few hundred miles, this oddity, called the South Atlantic Anomaly (SAA) becomes important, because spacecraft in these orbits periodically pass through the SAA and thus spend a few minutes during each passage exposed to higher particle flux than outside it. This passage through the SAA may require higher shielding for the crew, particularly during Extra-Vehicular Activities (EVAs) (i.e. space walks), and may also be of concern in the design of electronic devices.

An SEU may occur in digital, analog, and/or optical components or may have effects in surrounding circuitry. SEUs may typically be nondestructive, transient soft errors. An SEU such as, for example, a single bit flip, may not damage the circuitry involved, but may damage the subsystem or system by causing an undesired system action such as, for example, initiating a pyrotechnic device, positioning device, and/or the like.

SEUs typically appear as transient pluses in logic or support circuitry, or as bit flips in memory cells or registers. A multiple-bit SEU is also possible, in which a single ion hits two or more bits causing simultaneous errors. A multiple-bit SEU is a problem for single-bit error detection and correction (EDAC) schemes, where it may not be possible to determine which bits within a word may have been affected by the SEU. A severe type of SEU is the single-event functional interrupt (SEFI) in which an SEU in the device's control circuitry places the device into a test mode, halt, or undefined state. The SEFI may halt normal operations, and may require a power reset to recover.

The rate at which SEUs occur depends on a number of factors, including the materials and process used to manufacture the device, the orbit of the spacecraft containing the device, and the solar flare conditions. Upset rates vary from rarely during non-solar flare conditions to several thousand per device-day during solar flare conditions.

Static Random Access Memory (SRAM)-based Field Programmable Gate Arrays (FPGAs) are devices that may contain, in addition to functional logic, another layer of logic that controls data routing and the logic arrangement within the device. This additional layer of logic, referred to herein as configuration logic, may also be susceptible to upsets from charged particles. Reading the configuration data from the device, and verifying its correctness may detect configuration upsets. Once detected, reloading the configuration data for the portion of the device that has been upset may repair upsets to configuration logic. Alternatively, the device may be reconfigured continuously, without first checking for upsets. Configuration logic may have a higher upset rate, which may be due to the arrangement of transistors in the configuration memory (SRAM in the case of an SRAM-FPGA), than functional logic, typically by a factor of 40 to 160, depending on the orbit of the spacecraft and the solar flare conditions.

A common method for mitigating the effects of radiation within an electronic device is Triple Modular Redundancy (TMR). In TMR, each functional module within the device is implemented in triplicate. The final output is determined by a majority vote (2 of 3) of the intermediate outputs from the three functional modules. TMR may be effective at ensuring the correct data will be produced. However, the costs of the TMR method, namely the triple logic circuits and the triple power consumption, may often be prohibitive. For many applications, a 3 to 1 reduction in performance may not be acceptable.

The systems and methods of the present invention are effective for detecting and recovering from the effects of SEUs without the associated performance reduction and cost increases of TMR. Further, in the systems and methods of the present invention, a single module is used to process the data stream. In order to mitigate the SEUs, data are buffered before and after the processing module. A method of error detection is employed within the logic circuit to detect errors that occur within the configuration logic due to upsets from SEUs, for example, and reload the configuration data of the processing element in whole or in part. The error detection and reloading operation is referred to herein as a "scrub" operation. Further, as used herein, a scrub operation is described as "successful" if no errors were detected or as "unsuccessful" if errors were detected. If an error in the configuration logic is detected by a scrub operation during processing of the current data block, the output from that block is flushed from the output buffer, the configuration data is partially or fully reloaded, the current data block is retrieved from the input buffer and re-processed by the functional module.

The technique of the present invention combining buffering, error checking and re-configuring (scrubbing) and re-processing may reduce or eliminate the effects of detected upsets. For SRAM-based FPGAs, the systems and methods of the present invention may reduce or eliminate the effects of configuration upsets. Additionally, other error detection techniques, such as, for example, parity checking may be used on the memory and other circuitry sections to allow an embodiment of the present invention to eliminate a large portion of functional logic and memory upsets as well.

The systems and methods of the present invention may be implemented at any level, from the system level down to functional blocks within a single device. At the system level, system resources such as mass memory arrays and file management systems can be used to implement the buffers. At the sub-device level, small block memories may be incorporated into the device to serve as buffers.

BRIEF DESCRIPTION OF THE DRAWINGS

The present invention will be described with reference to the accompanying drawings, wherein.

DETAILED DESCRIPTION

The exemplary systems and methods of this invention will be described in relation to an FPGA. However, to avoid unnecessarily obscuring the present invention, the following description may omit, show in block diagram form or otherwise summarize well-known structures and devices. For the purposes of explanation, numerous specific details are set forth in order to provide a thorough understanding of the present invention. However, it should be appreciated that the present invention may be practiced in a variety of ways beyond these specific details. It should also be appreciated that while an FPGA is used for illustrative purposes, the present invention may be practiced on other types of hardware and software elements.

Figure 1:
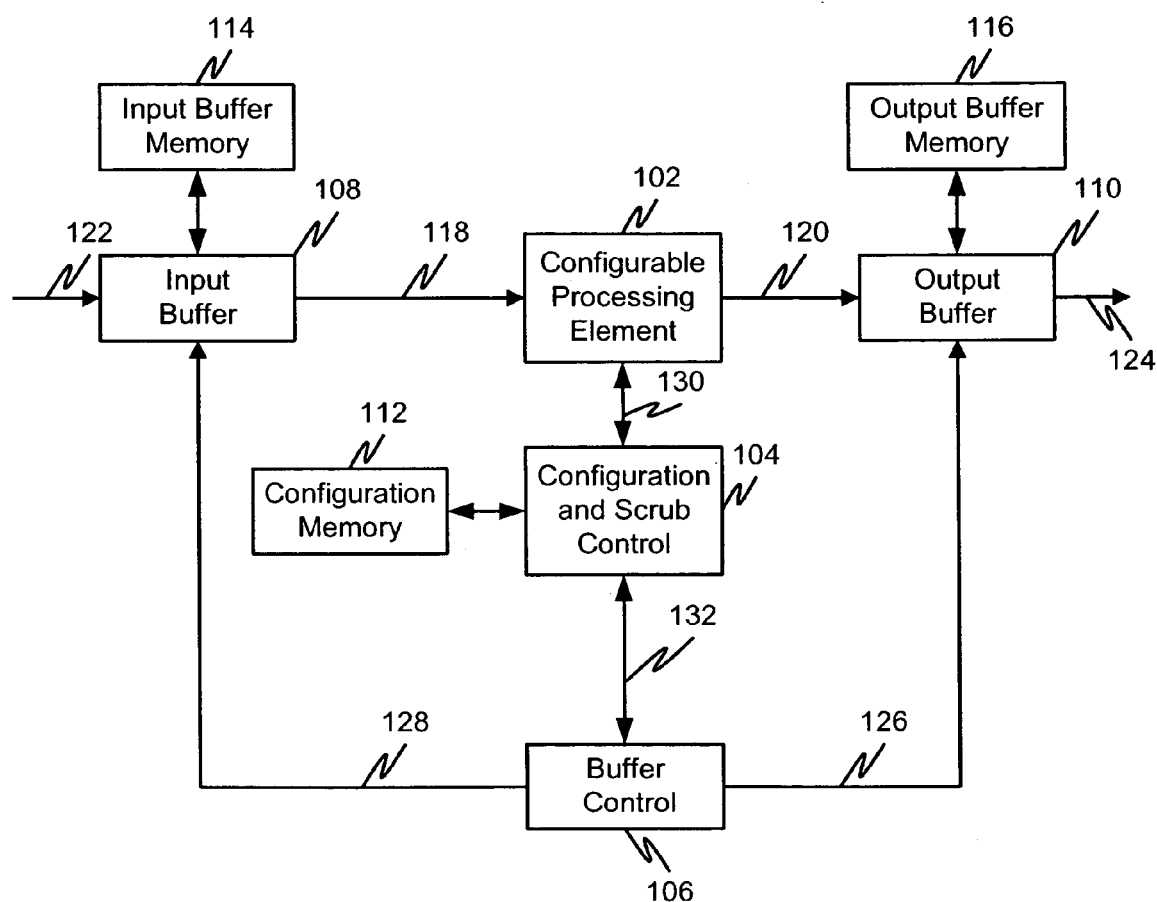
FIG. 1 is a block diagram of an exemplary embodiment of a circuit for detecting and recovering from soft errors in accordance with the present invention.

FIG. 1 is a block diagram of an exemplary embodiment of a circuit for detecting and recovering from soft errors in accordance with the present invention. In particular, the circuit 10 preferably comprises a configurable processing element 102 such as, for example, a programmed logic device such as a Programmable Read Only Memory (PROM), Electrically Erasable Programmable Read Only Memory (EEPROM), Programmable Logic Device (PLD), Programmable Logic Array (PLA), Field Programmable Gate Array (FPGA), Programmable Array Logic (PAL), or the like. In an alternate embodiment, circuit 10 comprises a non-configurable element, such as a processing Application Specific Integrated Circuit (ASIC) for example. An input buffer 108 is connected via a link 118 to the configurable processing element 102. An input buffer memory 114 is coupled to the input buffer 108. An output buffer 110 is connected via a link 120 to the configurable processing element 102. An output buffer memory 116 is coupled to the output buffer 110. A configuration and scrub control module 104 is coupled via a link 130 to the configurable processing element 102. A configuration memory is coupled to the configuration and scrub control module 104. A buffer control module 106 is coupled via a link 132 to the configuration and scrub control module 104, via a link 128 to the input buffer 108 and via link a 126 to the output buffer 110. The circuit 10 also comprises an input link 122 and an output link 124.

In operation, the circuit 10 is reset by a system reset or other such signal (not shown). The reset causes the pointers, registers, and memory locations to be set to a known state, a known value and/or an unknown logic state. After the reset signal is received, the configuration and scrub control module 104 configures the configurable processing element 102 via a configuration link 130 according to the configuration data stored in the configuration memory 112. Once the configurable processing element 102 has been configured, the configuration and scrub control module 104 signals the configurable processing element to begin operation.

The input buffer 108 receives data via a link 122. If the input buffer 108 is enabled, then the incoming data will be buffered and stored in the input buffer memory 114. If the input buffer 108 output is enabled, the buffered data will be sent to the configurable processing element 102 via a link 118. Once received by the configurable processing element 102, the data will be processed in accordance with the configuration of the processing element and the contemplated use of the circuit. Processed data are transmitted out of the configurable processing element 102 via a link 120 to the output buffer 110.

If enabled, the output buffer 110 will receive the incoming data, buffer the incoming data and store the data in the output buffer memory 116.

Periodically, if scrub is enabled, the configuration and scrub control module 104 will read back the configuration data from the configurable processing element 102 via the configuration link 130 and the configuration and scrub control module 104 checks the configuration data using an error checking technique, such as, for example, parity, checksum, and/or the like. The scrub operation may be performed without interrupting the operation of the FPGA (i.e. the configurable processing element 102). If an upset is detected, it can be corrected without interrupting the FPGA as well, but there is no way of determining the extent to which the error has propagated through the data and control logic. For this reason, the functional logic should be reconfigured and reset following the detection of a configuration error, and the data should be re-processed.

If no errors are detected in the configuration of the configurable processing element 102, then the data stored in the output buffer 110 is released, pointers in the input buffer 108 and output buffer 110 are adjusted and the processing continues. If an error is detected in the configuration, the configuration and scrub control module 104 reconfigures the area of the configurable processing element 102 containing the error, pointers in the input buffer 108 and output buffer 110 are adjusted and processing resumes. The configuration and scrub control module 104 signals the buffer control module 106 to adjust the input buffer 108 and output buffer 110 pointers. The buffer control module 106 controls the operations of the input buffer 108 and output buffer 110. The details of the pointer operations of the input buffer 108 and output buffer 110 are described in greater detail below.

The data in the input buffer 108 and output buffer 110 may also be protected against upsets in either the logic or the memory. For example, the logic may be protected through TMR, or may be rad-hard (i.e. designed and built to withstand the radiation environment of space) by design (implemented in a rad-hard process). The buffer memory may be protected, for example, through EDAC, since rad-hard memories may not typically be large enough for use as data buffers.

A "double play" technique may be used to protect the data from upsets in the functional logic of the processing FPGAs. In the double play method, the data are passed through the configurable processing element 102 twice. A checksum is generated from the output of the first pass, and the output data are discarded. The data are then processed a second time. The data from the second pass are buffered, and a second checksum is generated. If the checksums match, the data are assumed good, and may be output from the system. If the checksums do not match, the data are re-processed by the configurable processing element.

The double play technique may be used to mitigate upsets to the functional logic, eliminating a remaining source of radiation-induced errors. A "penalty" for using the double play approach may be a 2 to 1 reduction in throughput; this compares to a 3 to 1 reduction in throughput using TMR. The double play approach is optional. Block RAM memories may be protected using parity. A parity error would be treated the same as a configuration error, and would result in data re-processing.

Using the system and methods of the present invention, a burden on the system results when a configuration error is detected and the data must be re-processed by the configurable processing element. A minimal amount of overcapacity must be designed into a system in order to allow the system to "catch up" after an upset.

In an exemplary embodiment where the configurable processing element is an FPGA, upsets can occur (albeit infrequently) in the Power On Reset (POR) circuitry of the FPGA, and the SelectMap interface circuitry. These upsets are called Single Event Functional Interrupts (SEFIs). Because the physical area occupied by the POR and SelectMap logic is very small, these upsets may occur about once every 200 years under normal flare conditions. Both types of SEFI essentially clear the device, and can be detected by driving several pins to a '0' level and attaching pull-up resistors to the pins. If the device is correctly configured, the pin outputs will be '0'; if a SEFI has occurred, the pin outputs will be pulled to a '1'. These conditions may be detected, and treated similar to a configuration upset, with the resulting scrub operation and re-processing of data.

There is no overhead to memory or device throughput from performing the scrub operation, because it can be done without interrupting the device. The only overhead may come from the occasional need to re-process data when configuration errors are detected or from an optional double play error detection method.

The scrub interval, the time between scrub operations, is determined by the maximum rate at which configuration data can be read from the device, and by the number of devices that must be scrubbed. For example, the maximum access rate for an 8-bit SelectMap port may be 50 MHz, so, for example, given a 3 megabyte (MB) configuration data memory, a scrub operation would take approximately 60 ms per device. Accordingly, four devices could be scrubbed every 240 ms. The input and output buffer memories must be large enough to buffer a continuous input data stream during a re-processing event, while still retaining all of the data, which must be re-processed. Depending on the configurable processing element overcapacity, the input and output buffers may have the requirement to span multiple re-processing events before the first one is cleared.

Figure 2:
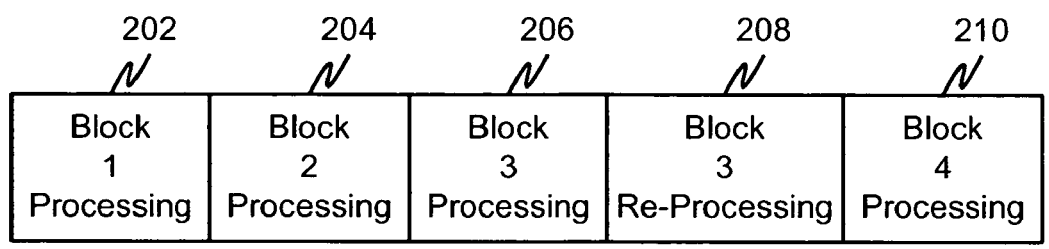
FIG. 2 is a sequence diagram of data block processing in accordance with the present invention.

FIG. 2 is a sequence diagram of exemplary data block processing in accordance with the present invention. In particular, data block 1 and 2 processing (202 and 204) occurs without any errors detected in the configuration of the configurable processing element (i.e. a successful scrub operation). After data block 3 processing 206, an error is detected and the configuration is reloaded (i.e. an unsuccessful scrub operation). Data block 3 is reprocessed 208 and no errors are detected. Processing then continues with data block 4 processing 210.

Figure 3:
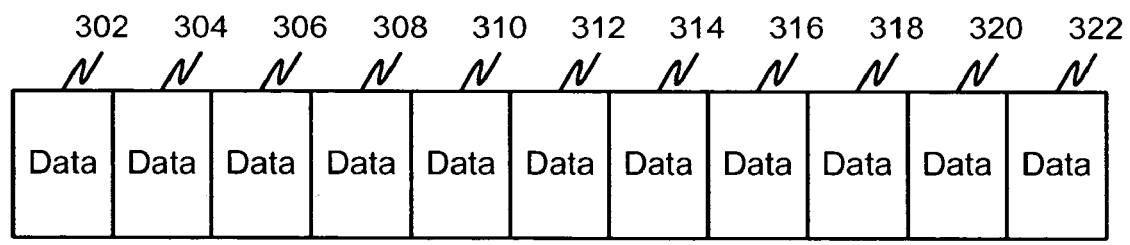
FIG. 3 is a sequence diagram of data block processing in accordance with the present invention.

FIG. 3 is a sequence diagram of exemplary data block processing in accordance with the present invention. In particular, FIG. 3 shows the timing effects of reprocessing data blocks that contain errors. A series of data blocks (302-308) is processed without any errors detected. After the processing of a next data block 310, an error is detected. Following the scrub operation, data block 310 is reloaded from the input buffer and reprocessed as a new data block 312. Processing then continues with the following data blocks (314-322), in which no errors are detected. The time cost of reprocessing the data block with errors 310 depends on the frequency of errors. The percent reduction in performance can be approximated by the following formula: % reduction=block interval*upsets/second. In the exemplary sequence timeline of FIG. 3, the impact is 10% additional processing time, given one upset every ten seconds and a one second block processing time. In yet another example, if the block processing time is reduced to one tenth of a second and the upset rate remains one every ten seconds, the performance impact is 1% additional processing time.

Figure 4:
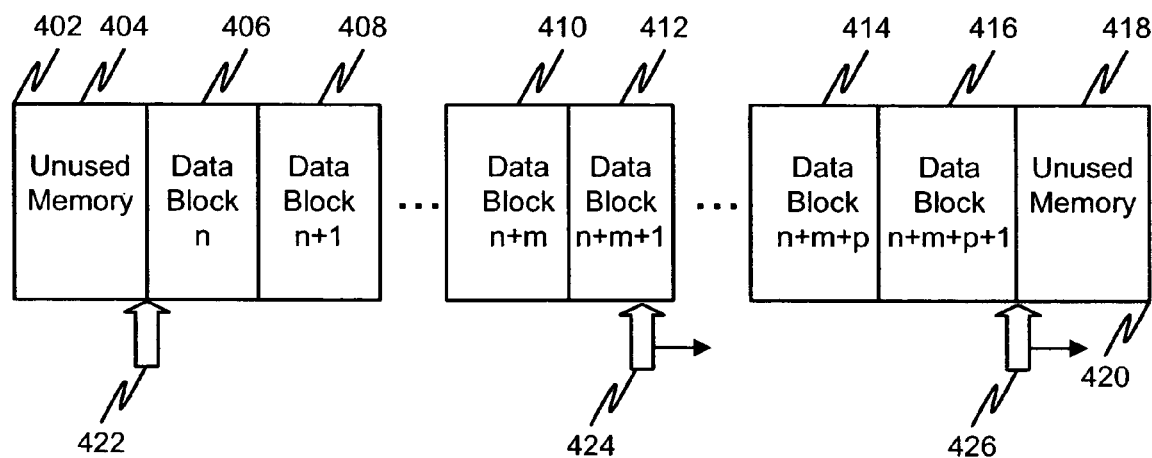
FIG. 4 is a diagram of data blocks and pointers in an exemplary embodiment of an input buffer in accordance with the present invention.

FIG. 4 is a diagram of a memory showing data blocks and pointers in an exemplary embodiment of an input buffer in accordance with the present invention. In particular, the memory has a starting address 402 and a section of unused memory 404. The memory also contains data blocks (406-416), another section of unused memory 418 and an ending address 420. The input buffer comprises a start of unchecked data (SUD) pointer 422, an output data pointer 424 and an input data pointer 426.

The SUD pointer 422 represents the location in memory after the location where the most recent scrub operation ended. In other words, the SUD pointer 422 represents the starting point of the data block that will have to be reprocessed if an error is detected by the next scrub operation. The output data pointer 424 represents the location of data that is being read by the configurable processing element. The input data pointer 426 represents the location where incoming data are being written in the input buffer memory.

In operation, the circuit is reset by a system reset line (not shown), which, in turn, resets the input buffer. During reset, the input data pointer 426, the output data pointer 424, and the SUD pointer are all set to zero, or the starting memory address 402. The input buffer then idles while waiting for data buffering to be enabled. When data buffering is enabled, the input buffer begins buffering data, dividing the received data into blocks of a pre-determined size. The input data pointer 426 is incremented with each new data word input.

The input buffer continues storing incoming data while waiting for data output to be enabled. When data output has been enabled, the input buffer begins outputting data to the configurable processing element. The output data pointer 424 is incremented as each word is sent to the configurable processing element, up to the memory address just prior to the address contained in the input data pointer.

After each data block is sent to the processor, it is retained in memory. As new blocks are received from the input source, they continue to be buffered in memory. The input buffer continues buffering and outputting data until it receives the results of a scrub operation. If the scrub is successful, the SUD pointer 422 is advanced to the start of the earliest block that was not fully processed prior to the scrub operation. If the scrub is unsuccessful, the output data pointer 424 is assigned the value of the SUD pointer 422, and the input buffer again idles awaiting the output enable command. In this manner the input buffer will re-supply the data to the configurable processing element during the time period which was covered by the last unsuccessful scrub operation, thereby effectively re-processing the data through the configurable processing element.

Figure 5:
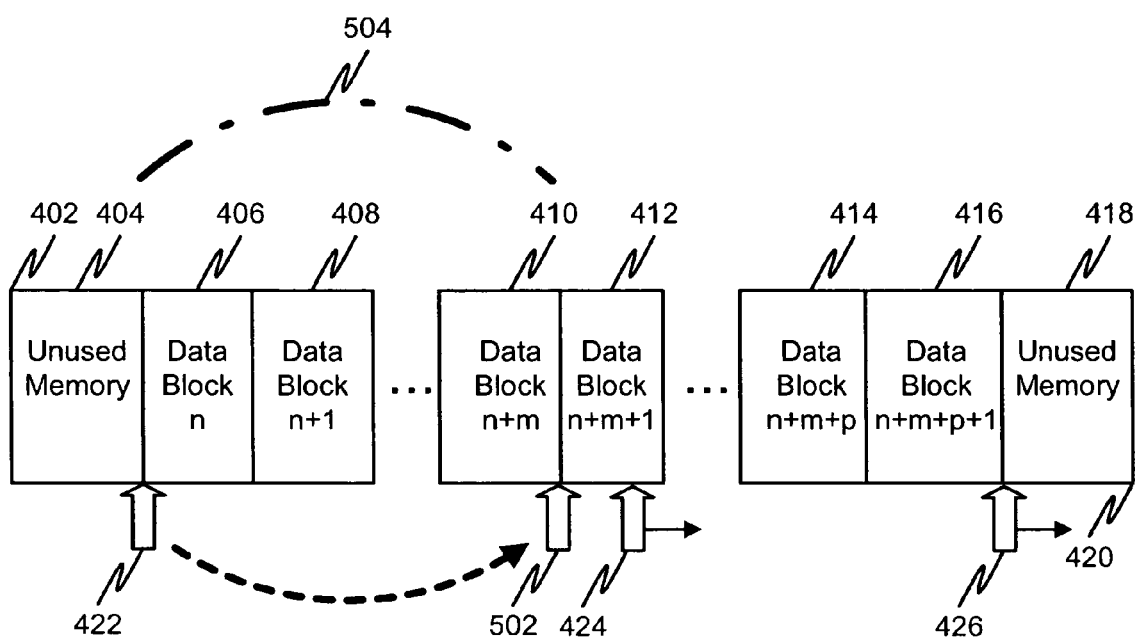
FIG. 5 is a diagram of data blocks and pointers following a successful scrub operation in an exemplary embodiment of an input buffer in accordance with the present invention.

FIG. 5 is a diagram showing, in greater detail, data blocks and pointers following a successful scrub operation in an exemplary embodiment of an input buffer in accordance with the present invention. In particular, following a successful scrub operation, the previous start of unchecked data (SUD) pointer 422 is advanced to a new location 502, which is just prior to the output data pointer 424 location at the time of the scrub operation.

Figure 6:
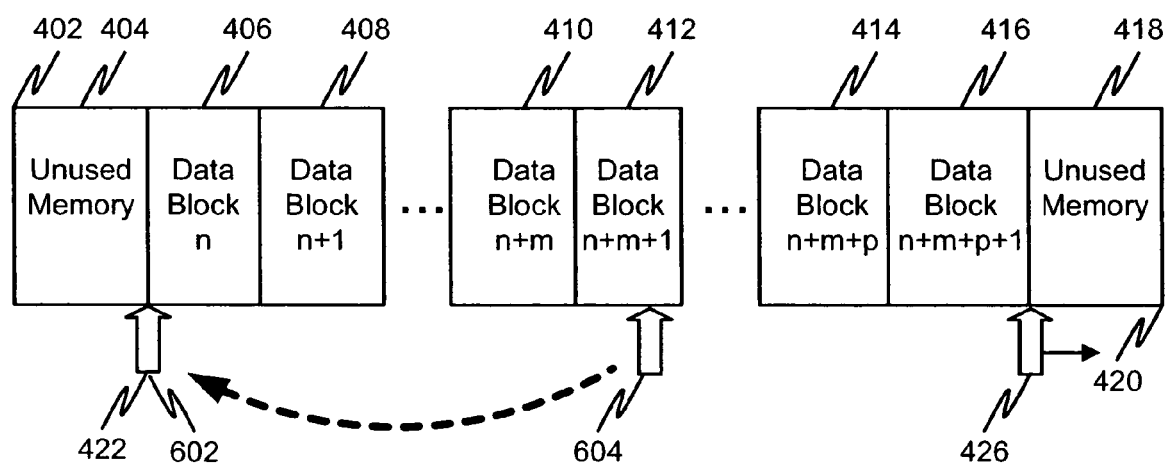
FIG. 6 is a diagram of data blocks and pointers following an unsuccessful scrub operation in an exemplary embodiment of an input buffer in accordance with the present invention.

FIG. 6 is a diagram showing, in greater detail, data blocks and pointers following an unsuccessful scrub operation in an exemplary embodiment of an input buffer in accordance with the present invention. In particular, after an unsuccessful scrub operation, the previous output data pointer 604 is moved back to a new location 602 in memory that corresponds to the SUD pointer 422. Accordingly, when the configurable processing element begins reading data again it will receive the data that had been previously processed during the time period in which the scrub operation detected an error in the configuration of the configurable processing element.

Figure 7:
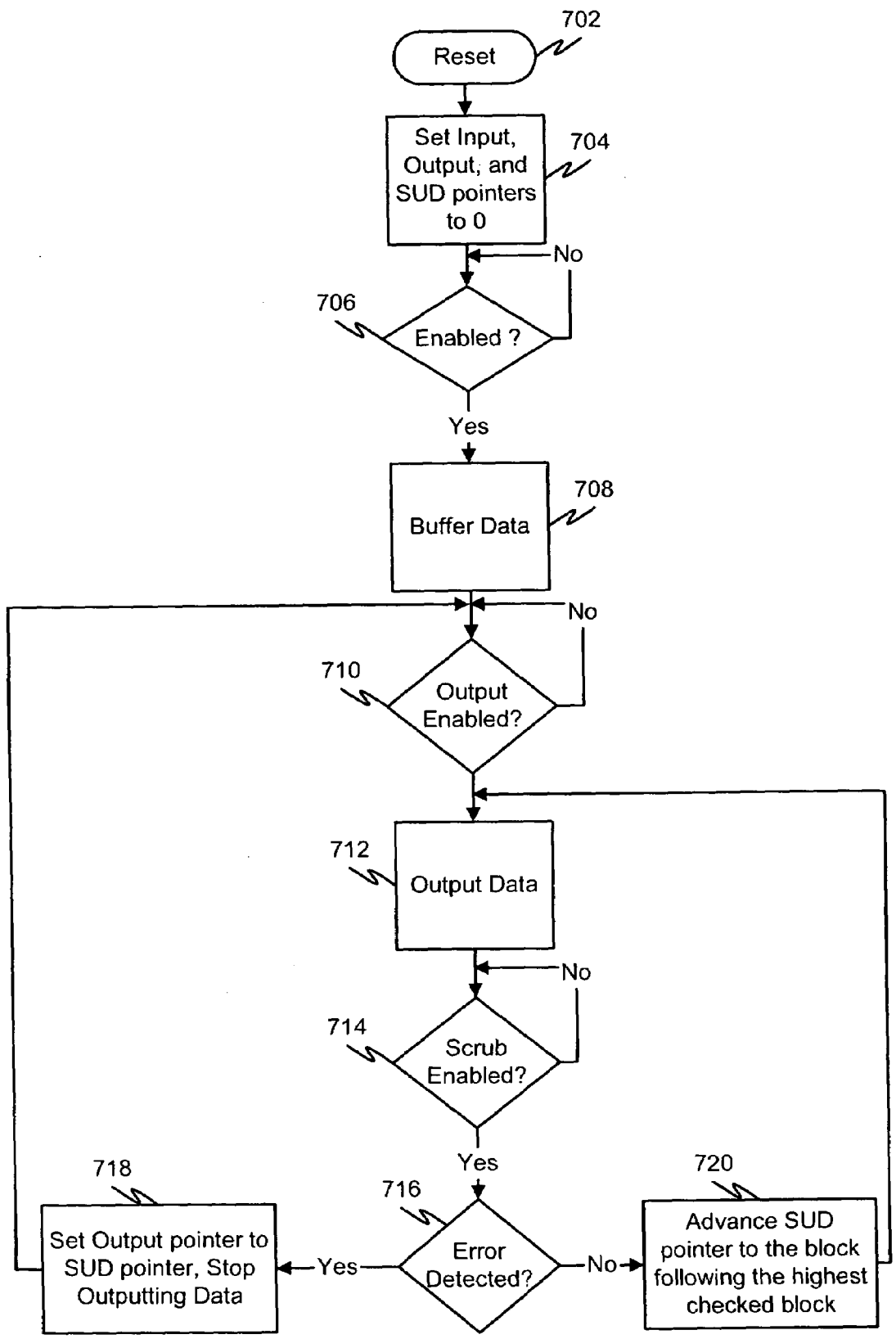
FIG. 7 is a flowchart showing the sequence of operation of an exemplary embodiment of an input buffer in accordance with the present invention.

FIG. 7 is a flowchart of an exemplary embodiment of a method of input buffer operation in accordance with the present invention. In particular, control begins at step 702 and continues to step 704. In step 704, the input data, output data and start of unchecked data pointers are all reset to zero. Control then continues to step 706.

In step 706, the status of the input buffer enable is evaluated. If the input buffer is enabled, control continues to step 708. If the input buffer is not enabled then control continues to remain in step 706 until the input buffer is enabled.

In step 708, input data are buffered and stored in the input buffer memory. Control then continues to step 710. In step 710, the status of the output enable signal is evaluated. If output is enabled, then control proceeds to step 712. If output is not enabled then the input buffer continues to buffer data and control remains in step 710 until output is enabled.

In step 712, data are output from the input buffer to the configurable processing element. Control then continues to step 714. In step 714, the scrub enable signal is evaluated. If scrub is not enabled, then the input buffer continues to buffer data and output data to the configurable processing element. If scrub is enabled, control continues to step 716.

In step 716, the results of the scrub operation are evaluated. If the scrub operation indicates that errors were detected, then control continues to step 718. If the scrub operation indicates that no errors were found then control continues to step 720.

In step 718, the output data pointer is set to the same value as the SUD pointer, the input buffer stops outputting data and control continues to step 710.

In step 720, the SUD pointer is advanced to the block following the highest checked block from the scrub operation. Control then continues to step 712.

Figure 8:
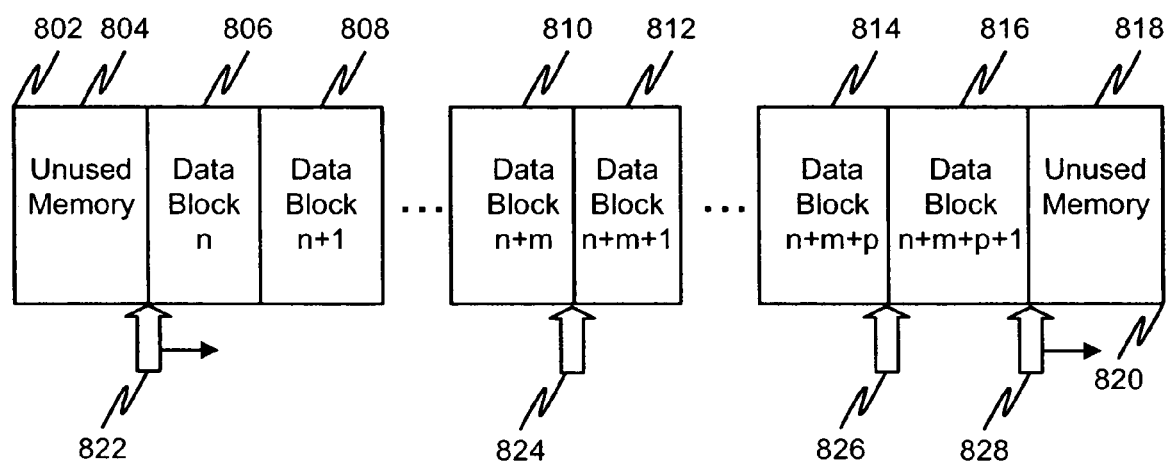
FIG. 8 is a diagram of data blocks and pointers in an exemplary embodiment of an output buffer in accordance with the present invention.

FIG. 8 is a diagram of data blocks and pointers in an exemplary embodiment of an output buffer in accordance with the present invention. In particular, the memory has a starting address 802 and a section of unused memory 804. The memory also contains data blocks (806-816), another section of unused memory 818 and an ending address 820. The output buffer comprises an output data pointer 822, a start of unchecked data (SUD) pointer 824, an end of unchecked data (ECD) pointer 826 and an input data pointer 828.

The SUD pointer 824 represents the location in memory after the location where the most recent scrub operation ended. In other words, the SUD pointer 824 represents the starting point of the data block that will have to be discarded if an error is detected by the next scrub operation. The output data pointer 822 represents the location of data that is being output by the output buffer. The input data pointer 828 represents the location where incoming data are being written in the output buffer memory. The ECD pointer 826 represents the location of the data block that was completed just prior to the scrub operation occurring. The ECD pointer 826 is assigned just prior to scrubbing.

In operation, the output buffer is reset by a system reset. The output buffer idles until it is enabled to receive data by the controller. Once enabled, the output buffer begins receiving data from the configurable processing element. Each block of processed data is preceded by a block-start signal, which delineates the beginning of each block. Each block of processed data is buffered, and assigned an incrementing number. The output buffer records the starting address of the processed data blocks.

The output buffer continues to buffer processed data until a start of scrub signal is received. When the start of scrub signal is received, the ECD pointer 826 is assigned to the end of the highest data block that has been entirely received. The block number of the last complete block is output, for use by the input buffer.

If the scrub is successful, the SUD pointer 824 is assigned the ECD pointer 826 value plus 1 (+1). If the scrub is unsuccessful, the input data pointer 828 is assigned the value of the SUD pointer 824. The output buffer outputs the processed data blocks that have been processed prior to a successful scrub operation.

Figure 9:
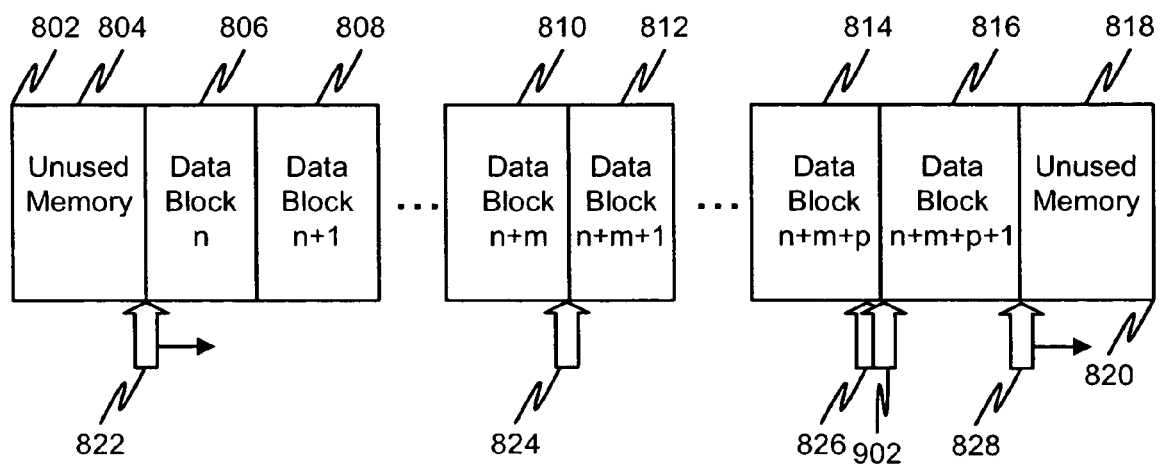
FIG. 9 is a diagram of data blocks and pointers following a successful scrub operation in an exemplary embodiment of an output buffer in accordance with the present invention.

FIG. 9 is a diagram showing, in greater detail, data blocks and pointers following a successful scrub operation in an exemplary embodiment of an output buffer in accordance with the present invention. In particular, the previous SUD pointer 824 is set to point to a new location 902 that is just after the location pointed to by the ECD pointer 826.

Figure 10:
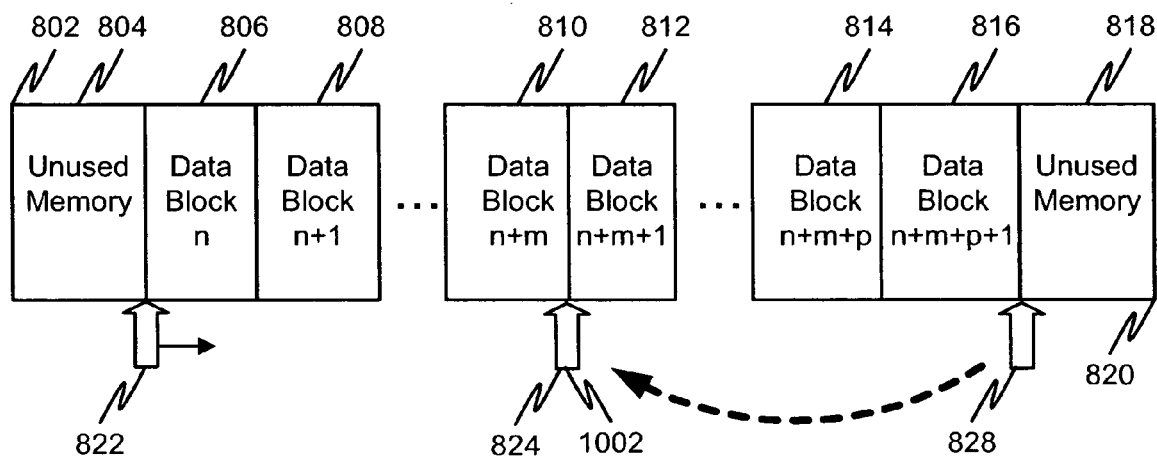
FIG. 10 is a diagram of data blocks and pointers following an unsuccessful scrub operation in an exemplary embodiment of an output buffer in accordance with the present invention.

FIG. 10 is a diagram showing, in greater detail, data blocks and pointers following an unsuccessful scrub operation in an exemplary embodiment of an output buffer in accordance with the present invention. In particular, following an unsuccessful scrub operation, the previous input pointer 828 is set to point to a new location 1002 that is the same as the location pointed to by the SUD pointer 824.

Figure 11:
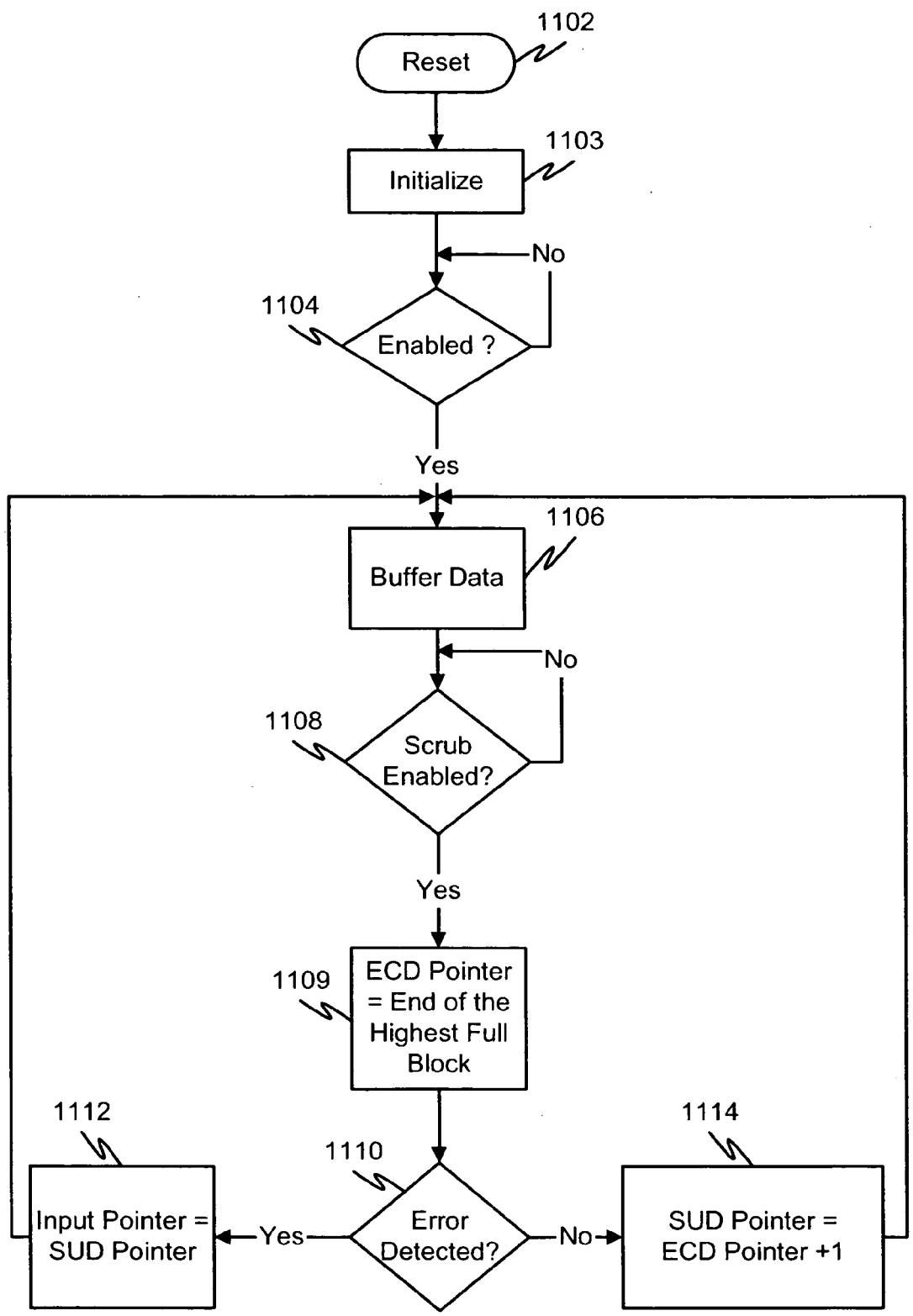
FIG. 11 is a flowchart showing the sequence of operation of an exemplary embodiment of an output buffer in accordance with the present invention.

FIG. 11 is a flowchart showing the sequence of operation of an exemplary embodiment of an output buffer in accordance with the present invention. In particular, control beings at step 1102. Control then continues to step 1103. In step 1103, pointers and registers used in the output buffer are initialized. Control continues to step 1104. In step 1104, the status of the output buffer enable signal is evaluated. If the output buffer is not enabled, then control remains in step 1104 until the output buffer is enabled. If the output buffer is enabled, then control continues to step 1106.

In step 1106, the data received from the configurable processing element is buffered and stored in the output buffer memory. Control then continues to step 1108. In step 1108, the status of the scrub enable signal is evaluated. If scrub is not enabled, then control remains in step 1108, with the output buffer still collecting and storing incoming data. If scrub is enabled, control continues to step 1109.

In step 1109, the ECD pointer is set to the end of the highest full block of data received. Control then continues to step 1110. In step 1110, the status of the error signal generated as a result of the scrub operation is evaluated. If an error was detected during the scrub operation, control continues to step 1112. In step 1112, the input pointer is set to the SUD pointer and control continues back to step 1106. If no errors were detected during the scrub operation, then control continues to step 1114. In step 1114, the SUD pointer is set to the ECD pointer value plus one. Control then continues back to step 1106.

Figure 12:
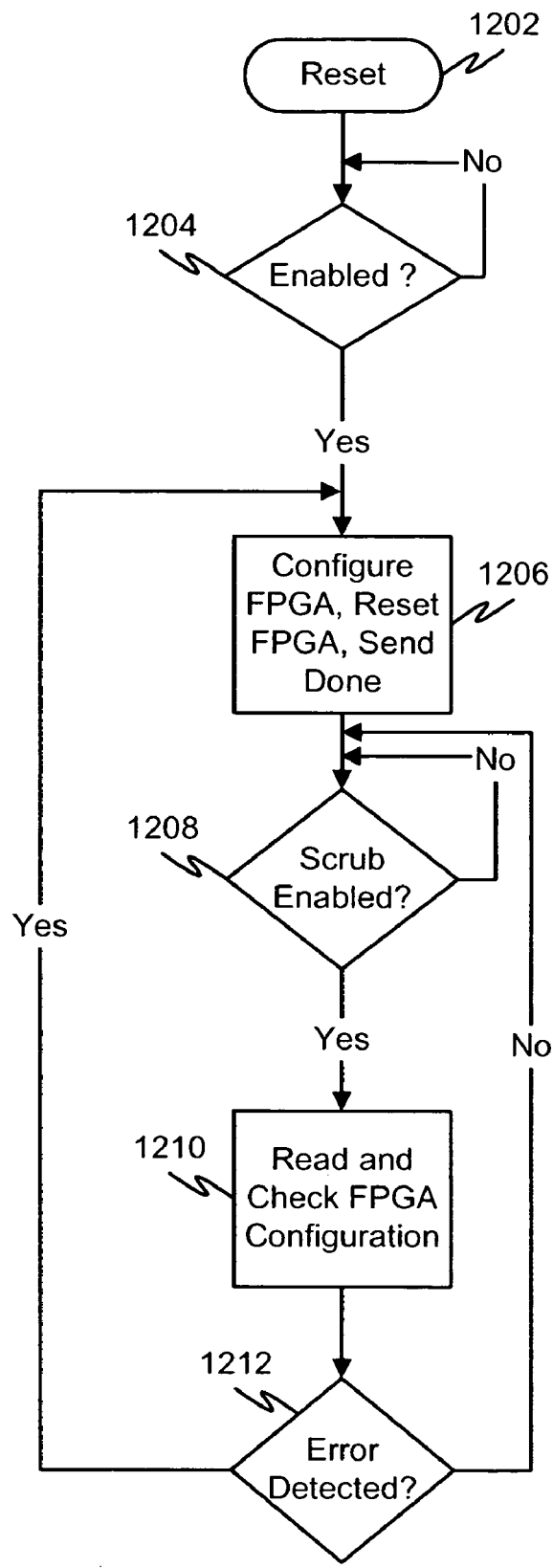
FIG. 12 is a flowchart showing the steps of an exemplary scrub operation in accordance with the present invention.

FIG. 12 is a flowchart showing the steps of an exemplary scrub operation in accordance with the present invention. The Configuration and Scrub Control Module (CSCM) is responsible for loading the configuration data into the configurable processing element through a configuration port. The CSCM accesses external memory (usually non-volatile memory such as FLASH) to retrieve the configuration information, and configures the configurable processing element. The CSCM also reads the configuration data back from the configurable processing element and checks it. The checking may be accomplished by any of several methods, such as, for example, generating checksums for some unit of configuration data ranging in size from a frame to the entire configuration data file, and comparing these checksums to previously calculated checksums also stored in non-volatile memory.

Control begins in step 1202 and continues to step 1204. In step 1204, the CSCM idles until it receives a configuration-enable signal from the system controller. Once a configuration-enable signal is received, control continues to step 1206. In step 1206, the CSCM configures the configurable processing element from memory, such as, for example, non-volatile memory. The CSCM then resets the processor and sends a configuration done signal. Control then continues to step 1208.

In step 1208, the CSCM waits to receive a scrub enable signal from the buffer control module. When the scrub enable signal is received, control continues to step 1210. In step 1210, the CSCM reads the configuration data back from the configurable processing element and checks it. When the check is completed, the CSCM generates an error signal, to indicate if errors were detected. Control then continues to step 1212.

In step 1212, the status of the error signal generated by the scrub operation is evaluated. If an error was detected control continues back to step 1206. The CSCM fixes the error by reloading a portion of the device, or the entire device. If no error was detected, control continues back to step 1208 and data processing continues.

Figure 13:
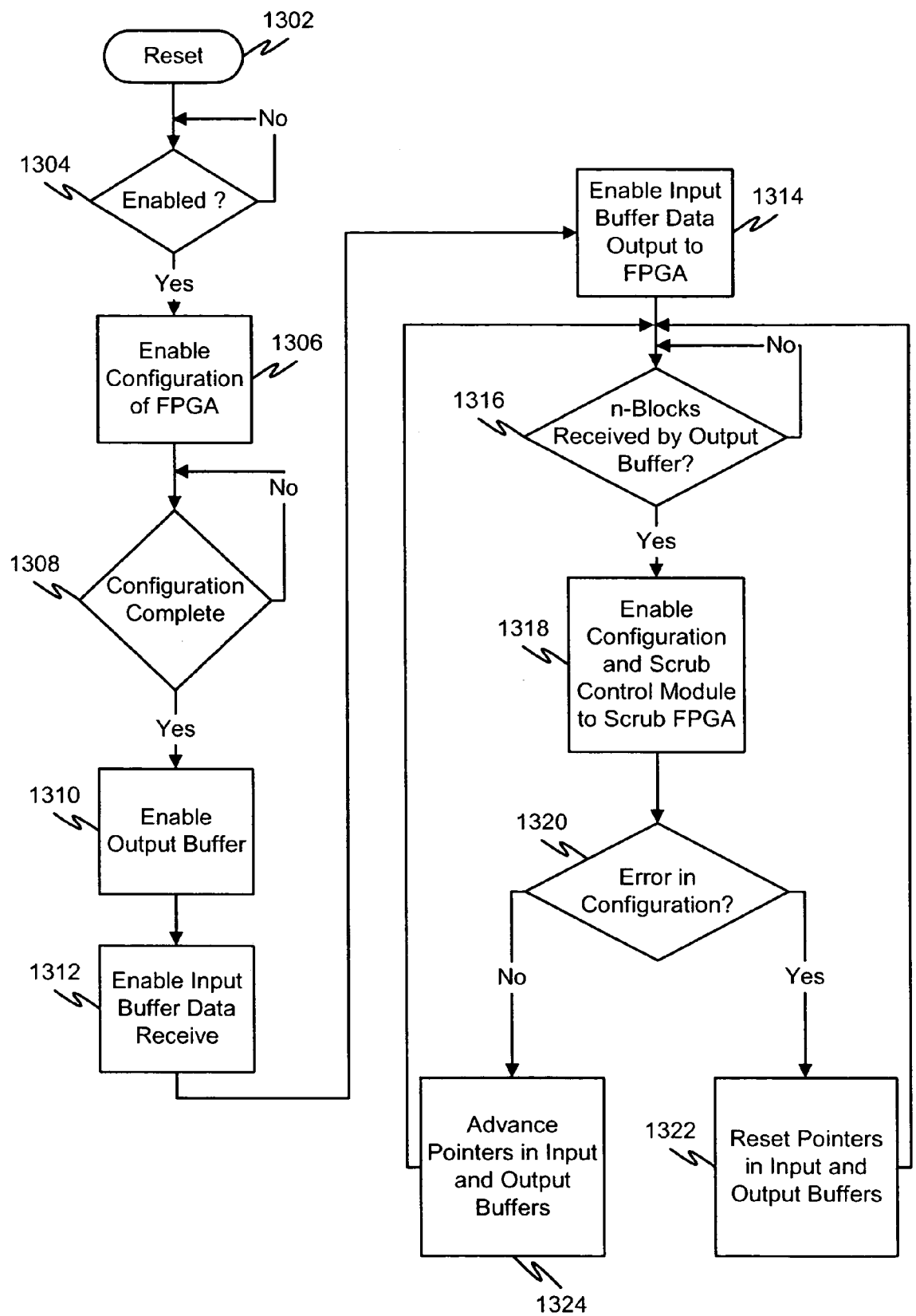
FIG. 13 is a flowchart showing the sequence of operation of an exemplary embodiment of a buffer control module in accordance with the present invention.

FIG. 13 is a flowchart showing the sequence of operation of an exemplary embodiment of a buffer control module in accordance with the present invention. The buffer control module is intended to oversee the operation of the input buffer and the output buffer, and to request re-processing whenever a configuration error is detected. The buffer control module directs the input buffer to send data blocks to the configurable processing element, and resets the input buffer to an earlier block if a configuration upset (error) is detected. The buffer control module enables the output buffer, and directs the output buffer to discard processed data blocks that were created when an error was present in the configuration of the configurable processing element. The buffer control module also enables the output buffer to output processed blocks that were processed during a time period when the configuration was determined to be error free by a successful scrub operation.

In operation, the buffer control module control begins at step 1302. In step 1302, the buffer control module receives a reset signal from the system reset. Control then continues to step 1304. In step 1304, the buffer control module waits for an enable signal. When the buffer control module receives an enable signal, control continues to step 1306. In step 1306, the buffer control module enables the CSCM block to configure the FPGA processor (configurable processing element). Control continues to step 1308.

In step 1308, the buffer control module waits for the configuration of the FPGA to complete. Once the configuration of the FPGA is complete, control continues to step 1310.

In step 1310, the buffer control module enables the output buffer to start receiving data. Control then continues to step 1312. In step 1312, the buffer control module enables the input buffer to start receiving data from the input source. Control then continues to step 1314.

In step 1314, the buffer control module enables the input buffer to start sending data to the FPGA processor. Control then continues to step 1316. In step 1316, the buffer control module waits until the output buffer has received a predetermined number of blocks. Once the output buffer has received a predetermined number of blocks, control continues to step 1318.

In step 1318, the buffer control module enables the CSCM to scrub the FPGA configuration. The buffer control module also signals the output buffer to register the end address of the highest fully received block in the output buffer's ECD pointer. Control then continues to step 1320.

In step 1320 an error signal generated as a result of the scrub operation is evaluated. If the scrub finds no errors in configuration data, control continues to step 1324. In step 1324, the buffer control module signals the output buffer that the blocks, which were processed prior to the latest scrub, may be output. The buffer control module signals the input buffer that it need not buffer the blocks that were processed prior to the latest scrub. The input buffer uses the highest-scrubbed-block output from the output buffer to move the SUD pointer to the start of the lowest unscrubbed block, freeing memory. Control then continues back to step 1316.

If the scrub finds errors, control continues to step 1322. In step 1322, the buffer control module signals the CSCM to fix the configuration error by reconfiguring the device, either in part or in whole. The buffer control module waits for the configuration and scrub control module to reconfigure the device. The buffer control module signals the output buffer to discard the blocks that were processed during the period of time when there was a configuration upset. The buffer control module signals the input buffer to re-process the data blocks into the FPGA processor, starting with the lowest numbered block. The buffer control module then enables the input buffer to start outputting data to the processing FPGA. Control then continues back to step 1316.

If the re-processing technique is performed as described, errors due to configuration upsets can be reduced and/or eliminated, leaving only the functional logic upsets and block RAM upsets. This greatly reduces the rate of system errors, since the upset rate for configuration logic is typically 40 to 160 times higher than that for functional logic. For some applications, the rate of functional logic upsets may be low enough to allow operation of the system without additional mitigation techniques. Tables 1 and 2 show exemplary rates of functional and configuration upsets for the Xilinx Virtex-II 6000 device for Low Earth Orbits (LEOs) and Geosynchronous Earth Orbits (GEOs). Only about 1 in 10 configuration upsets cause errors in operation, so the configuration latch upset rate has been divided by 10 to produce the final upsets/day.

TABLE 1

LEO Functional Device Upset Rates
Orbit - 1000 km, 90 deg, Upsets/device-day
2V6000 with 100% Resource allocation

| Element | GCR max | Worst Day | Worst Week Day |
|---|---|---|---|
| Config Latch | 16.5 | 734.3 | 195.2 |
| Config Latch Causing Error | 1.7 | 73.4 | 19.5 |
| Block RAM | 2.9 | 138.4 | 37.2 |
| CLB Flip-flop | 0.1 | 17.4 | 2.0 |
| POR SEFI | 1.4E–05 | 1.5E–03 | 3.2E–04 |
| SelectMap SEFI | 1.9E–05 | 1.8E–03 | 4.3E–04 |
| Totals | 4.7 | 229.3 | 58.7 |

TABLE 2

GEO Functional Device Upset Rates
Orbit - GEO, Upsets/device-day
2V6000 with 100% Resource allocation

| Element | GCR max | Worst Day | Worst Week Day |
|---|---|---|---|
| Config Latch | 6.4 | 2736.4 | 671.4 |
| Config Latch Causing Error | 0.6 | 273.6 | 67.1 |
| Block RAM | 1.3 | 513.5 | 127.6 |
| CLB Flip-flop | 0.1 | 22.6 | 6.4 |
| POR SEFI | 1.4E–05 | 5.4E–03 | 1.3E–03 |
| SelectMap SEFI | 1.6E–05 | 6.7E–03 | 1.5E–03 |
| Totals | 2.0 | 809.7 | 201.2 |

For the majority of orbits and flare conditions, most of the upsets for the device may occur in the block RAM, followed by errors in the configuration latches. If configuration checking and parity are used to mitigate the effects of these upsets, the remaining functional upset rates are reduced to those errors occurring in the configurable logic block (CLB) flip-flops. The CLB may consist mainly of Look-Up Tables (LUTs) and flip-flops. Exemplary improvements in device upset rates by using the above techniques are shown in Tables 3 and 4.

TABLE 3

LEO Functional Upset Rates with Parity and Re-processing
Orbit - 1000 km, 90 deg, Upsets/device-day
2V6000 with 100% Resource allocation

| Element | GCR max | Worst Day | Worst Week Day |
|---|---|---|---|
| Config. Latch | 0 | 0 | 0 |
| Block RAM | 0 | 0 | 0 |
| CLB Flip-Flop | 0.1 | 17.4 | 2 |
| POR SEFI | 1.40E–05 | 1.50E–03 | 3.20E–04 |
| SelectMap SEFI | 1.90E–05 | 1.80E–03 | 4.30E–04 |
| Totals | 0.100033 | 17.4033 | 2.00075 |
| Unmitigated Totals | 4.7 | 229.3 | 58.7 |
| Improvement Factor | 46.87 | 13.17 | 29.33 |

TABLE 4

GEO Functional Upset Rates with Parity and Re-processing
Orbit - GEO, Upsets/device-day
2V6000 with 100% Resource allocation

| Element | GCR max | Worst Day | Worst Week Day |
|---|---|---|---|
| Config. Latch | 0 | 0 | 0 |
| Block RAM | 0 | 0 | 0 |
| CLB Flip-Flop | 0.1 | 17.4 | 2 |
| POR SEFI | 1.4E–05 | 5.4E–03 | 1.3E–03 |
| SelectMap SEFI | 1.6E–05 | 6.7E–03 | 1.5E–03 |
| Totals | 0.10 | 17.41 | 2.00 |
| Unmitigated Totals | 2.0 | 809.7 | 201.2 |
| Improvement Factor | 19.88 | 46.50 | 100.47 |

These examples demonstrate that the scrub operation combined with re-processing and parity can improve the functional upset rate for the Virtex-II 6000 device by a factor ranging from 13 to 100. For non-flare conditions, the functional upset rate may be about 1 occurrence every ten device-days. Further, the use of the re-processing technique may allow for implementation of two-pass error detection during solar flare conditions, which may effectively eliminate functional upsets at a cost of a 2 to 1 reduction in data rate, an improvement over the 3 to 1 cost in logic and power consumption with TMR.

A logic circuit for detecting and recovering from soft errors, in accordance with the present invention, can be implemented on a general-purpose computer, a special-purpose computer, a programmed microprocessor or microcontroller and peripheral integrated circuit element, and ASIC or other integrated circuit, a digital signal processor, a hardwired electronic or logic circuit such as a discrete element circuit, a programmed logic device such as a PLD, PLA, FPGA, PAL, or the like. In general, any process capable of implementing the functions described herein can be used to implement a system for detecting and recovering from soft errors according to this invention.

Furthermore, the disclosed system may be readily implemented in software using object or object-oriented software development environments that provide portable source code that can be used on a variety of computer platforms. Alternatively, the disclosed system for detecting and recovering from soft errors may be implemented partially or fully in hardware using standard logic circuits or a VLSI design.

Other hardware or software can be used to implement the systems in accordance with this invention depending on the speed and/or efficiency requirements of the systems, the particular function, and/or a particular software or hardware system, microprocessor, or microcomputer system being utilized. The soft error detection and recovery system illustrated herein can readily be implemented in hardware and/or software using any known or later developed systems or structures, devices and/or software by those of ordinary skill in the applicable art from the functional description provided herein and with a general basic knowledge of the computer and electrical arts.

Moreover, the disclosed methods may be readily implemented in software executed on programmed general-purpose computer, a special purpose computer, a microprocessor, or the like. In these instances, the systems and methods of this invention can be implemented as program embedded on personal computer such as JAVA® or CGI script, as a resource residing on a server or graphics workstation, as a routine embedded in a dedicated encoding/decoding system, or the like. The system can also be implemented by physically incorporating the system and method into a software and/or hardware system, such as the hardware and software systems of an image processor.

It is, therefore, apparent that there is provided in accordance with the present invention, systems and methods for detecting and recovering from soft errors. While this invention has been described in conjunction with a number of embodiments, it is evident that many alternatives, modifications and variations would be or are apparent to those of ordinary skill in the applicable arts. Accordingly, applicants intend to embrace all such alternatives, modifications, equivalents and variations that are within the spirit and scope of this invention.

What is claimed is:

1. A logic circuit for detecting and recovering from soft errors in a spacecraft comprising:
   a configurable processing module for processing data in the spacecraft;
   an input buffer coupled to the configurable processing module and configured to receive input data on board a spacecraft;
   an input buffer memory coupled to the input buffer for storing input data;
   an output buffer coupled to the configurable processing module for receiving output data;
   an output buffer memory coupled to the output buffer for storing output data;
   a configuration and scrub control module coupled to the configurable processing module for configuring and scrubbing the configurable processing module, wherein the configuration and scrub control module comprises means for reading and checking configurable processing module configuration data for errors and at least partially reloading the configurable processing module configuration data found to contain errors;
   a configuration memory coupled to the configuration and scrub control module for storing configuration data; and
   a buffer control module coupled to the configuration and scrub control module, the input buffer and the output buffer and comprising means for controlling the operation of the input buffer, the output buffer and the configuration and scrub control module, wherein the buffer control module comprises means for erasing at least a portion of the output data and causing at least a portion of the input data to be re-processed if an error is indicated and releasing at least a portion of the output data if no error is indicated.

2. The logic circuit of claim 1, wherein the input buffer comprises an input data address register, an output data address register and a start of unchecked data address register.

3. The logic circuit of claim 1, wherein the output buffer comprises an input data address register, an output data address register, a start of unchecked data register and an end of checked data address register.

4. The logic circuit of claim 1, wherein the configuration memory is volatile.

5. The logic circuit of claim 1, wherein the configuration memory is non-volatile.

6. The logic circuit of claim 1, wherein the configurable processing module is a Field Programmable Gate Array.

7. A method for detecting and recovering from a soft error in a spacecraft comprising:
   configuring a processing element in a spacecraft from memory;
   receiving and storing input data;
   processing the input data;
   producing output data;
   storing the output data prior to release;
   reading and checking processing element configuration data for errors with a configuration and scrub control module adapted to configure and scrub the processing element, the configuration and scrub control module being configured to read and check the processing element configuration data for errors and to at least partially reload the processing element configuration data found to contain errors;
   reloading the processing element, erasing at least a portion of the output data and reprocessing at least a portion of the input data if an error is indicated, the reloading, erasing and reprocessing being controlled by a buffer control module coupled to the configuration and scrub control module, an input buffer and an output buffer, the buffer control module being configured to control the operation of the input buffer, the output buffer and the configuration and scrub control module; and
   releasing at least a portion of the output data if no error is indicated, the releasing being controlled by the buffer control module.

8. The method of claim 7, wherein the step of configuring the processing element in a spacecraft from memory comprises:
   receiving a reset signal;
   receiving a configuration enable signal;
   accessing a configuration memory; and
   configuring a configurable processing element according to the data stored in the configuration memory.

9. The method of claim 7, wherein the step of receiving and storing the input data further comprises storing data in a memory according to an address indicated by an input data pointer.

10. The method of claim 7, wherein the step of processing the input data comprises passing the data through the configurable processing element, wherein the configurable processing element performs operations in accordance with the configuration.

11. The method of claim 7, wherein the step of storing the output data comprises placing the output data in a memory according to an address indicated by an output data pointer.

12. The method of claim 7, wherein the step of reading and checking the processing element configuration data for errors comprises:
   retrieving the configuration data from a configurable processing element;
   checking the configuration data for errors; and
   generating a signal indicating whether or not errors were detected in the configuration data.

13. The method of claim 7, wherein the step of reloading the processing element, erasing at least a portion of the output data and reprocessing at least a portion of the input data comprises:
   reconfiguring at least a portion of the configuration data containing detected errors of the configurable processing element;
   setting an input pointer to an address of the beginning of the data processed during a time when an error was detected;
   discarding output data that was generated during a time when an error was detected; and
   resetting the configurable processing element to resume data processing.

14. The method of claim 7, wherein the step of releasing at least a portion of the output data comprises moving a pointer to a location that is one location beyond a last location checked during the previous scrub operation.

15. A system for detecting and recovering from soft errors comprising:
   a configurable processor;
   an input buffer coupled to the configurable processor;
   an input buffer memory coupled to the input buffer;
   an output buffer coupled to the configurable processing module for receiving output data;
   an output buffer memory coupled to the output buffer;
   a configuration and scrub control module coupled to the configurable processor, wherein the configuration and scrub control module is configured to read and check configurable processor configuration data for errors and at least partially reload the configurable processor configuration data containing errors;
   a configuration memory coupled to the configuration and scrub control module; and
   a buffer control module coupled to the configuration and scrub control module, the input buffer and the output buffer, wherein the buffer control module is configured to erase at least a portion of the output data and cause at least a portion of the input data to be re-processed if an error is indicated and release at least a portion of the output data if no error is indicated.

16. The system of claim 15, wherein the input buffer comprises an input data address register, an output data address register and a start of unchecked data address register.

17. The system of claim 15, wherein the output buffer comprises an input data address register, an output data address register, a start of unchecked data register and an end of unchecked data address register.

18. The system of claim 15, wherein the configuration memory is volatile.

19. The system of claim 15, wherein the configuration memory is non-volatile.

20. The system of claim 15, wherein the configurable processor is a Field Programmable Gate Array.

* * * * *